United States Patent
Ikuma et al.

(10) Patent No.: US 9,621,196 B2
(45) Date of Patent: Apr. 11, 2017

(54) HIGH-FREQUENCY MODULE AND MICROWAVE TRANSCEIVER

(71) Applicant: Kabushiki Kaisha Toshiba, Minato-ku (JP)

(72) Inventors: Yoshiyuki Ikuma, Kamakura (JP); Masatoshi Suzuki, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/057,325

(22) Filed: Mar. 1, 2016

(65) Prior Publication Data

US 2016/0261292 A1 Sep. 8, 2016

(30) Foreign Application Priority Data

Mar. 5, 2015 (JP) .................................. 2015-043439

(51) Int. Cl.
| | | |
|---|---|---|
| H04B 1/02 | (2006.01) | |
| H04B 1/036 | (2006.01) | |
| H01L 23/552 | (2006.01) | |
| H01L 23/66 | (2006.01) | |
| H01L 23/057 | (2006.01) | |
| H04B 1/034 | (2006.01) | |

(52) U.S. Cl.
CPC ........... *H04B 1/036* (2013.01); *H01L 23/057* (2013.01); *H01L 23/552* (2013.01); *H01L 23/66* (2013.01); *H01L 2223/6627* (2013.01); *H01L 2223/6644* (2013.01)

(58) Field of Classification Search
CPC ...... H04B 1/036; H01L 23/66; H01L 2924/00
USPC ........................... 455/91; 361/712, 719, 720
See application file for complete search history.

(56) References Cited

U.S. PATENT DOCUMENTS

| | | | | |
|---|---|---|---|---|
| 5,796,165 A | * | 8/1998 | Yoshikawa | ........... H01L 23/053 257/698 |
| 7,002,080 B2 | | 2/2006 | Tani et al. | |
| 2003/0060172 A1 | * | 3/2003 | Kuriyama | .............. H04B 1/036 455/575.1 |
| 2004/0040738 A1 | | 3/2004 | Tani et al. | |

FOREIGN PATENT DOCUMENTS

| | | |
|---|---|---|
| JP | 2004-87856 | 3/2004 |
| JP | 2012-235036 | 11/2012 |

* cited by examiner

*Primary Examiner* — Lee Nguyen
(74) *Attorney, Agent, or Firm* — Oblon, McClelland, Maier & Neustadt, L.L.P.

(57) ABSTRACT

A high-frequency module according to an embodiment includes a first board, a first device, a second board, a metal core, and a casing. The first board is formed with an opening, and has a surface at a first side on which a transmission circuit transmitting microwaves is formed. The first device is disposed in the opening of the first board. The second substrate is disposed at a second side of the first board. The second substrate is formed with a control circuit for the first device, and has an opening at a location overlapping the first device. The metal core is disposed between the first board and the second board, and is in contact with the first device. The casing includes a connection connected with the metal core via an opening formed in the second board.

14 Claims, 10 Drawing Sheets

HIGH-FREQUENCY MODULE AND MICROWAVE TRANSCEIVER

CROSS-REFERENCE TO RELATED APPLICATIONS

This application is based upon and claims the benefit of priority from the prior Japanese Patent Application No. 2015-043439, filed on Mar. 5, 2015; the entire contents of which are incorporated herein by reference.

FIELD

Embodiments of the present disclosure relate to a high-frequency module and a microwave transceiver.

BACKGROUND

In recent years, in accordance with the improvement of high functionality and multi-functionality of semiconductor devices, and of an operation speed thereof, the amount of heat generated by such semiconductor devices tends to increase. Hence, in the case of a multilayer wiring board that includes an insulation layer containing, for example, normal glass woven cloth or glass non-woven cloth, it is difficult to efficiently treat heat generated by a high-output power amplifier. In addition, according to this multilayer wiring board, an electromagnetic shielding effect, and an electromagnetic interference shielding effect are not expectable, and thus it is difficult to suppress an electromagnetic interference by shielding electromagnetic waves.

Measures to efficiently dissipate heat generated by a power amplifier are taken in a wiring board on which the power amplifier is mounted. According to conventional wiring boards, heat from the power amplifier is transferred to a heat sink provided on the wiring board via through-holes and conductor patterns. The heat sink dissipates the transferred heat to the exterior.

However, each through-hole does not have a sufficient heat transfer performance, and the dimension of the heat sink has a restriction. Hence, according to conventional technologies, it is difficult to mount a power amplifier that has a relatively large amount of heat generation per a unit area on the wiring board.

In addition, in recent years, researches and developments are enhanced to improve a transmission output by applying a gallium nitride (GaN) transistor for the power amplifier so as not to increase the dimension of a microwave transceiver. Since the GaN transistor has a large output, a total amount of heat generation and an amount of heat generation per a unit area are relatively large. Conversely, when cooling is insufficient, the operation becomes unstable, and the product lifetime becomes short. Hence, it is necessary to improve the heat dissipation effect in the wiring board in order to enable such a power amplifier to be mounted thereon.

In addition, conventional microwave transceivers are constructed by a combination of a metal plate, a casing which will be a heat spreader, and a monolayer board or a multilayer board. Conventional microwave transceivers have disadvantages in at least any one of a high-frequency performance (discontinuity of grounding), a reliability (a deterioration of joined portions due to a difference of thermal expansion rate of components), an electromagnetic compatibility, and a price.

DETAILED DESCRIPTION

A high-frequency module according to this embodiment includes a first board in which an opening is formed, and which includes a transmission circuit formed on a surface at a first side, the transmission circuit transmits a microwave, a first device disposed in the opening of the first board, a second board which is disposed at a second side of the first board which is formed with a control circuit for the first device, and in which an opening is formed at a location overlapping the first device, a metal core which is disposed between the first board and the second board, and which is in contact with the first device, and a casing which is formed of a metal, and which includes a connection connected with the metal core via the opening of the second board.

An embodiment of the present disclosure will be explained below with reference to the figures. In the following explanation, an XYZ coordinate system that includes an X axis, a Y axis, and a Z axis orthogonal to one another is adopted.

Figure 1:
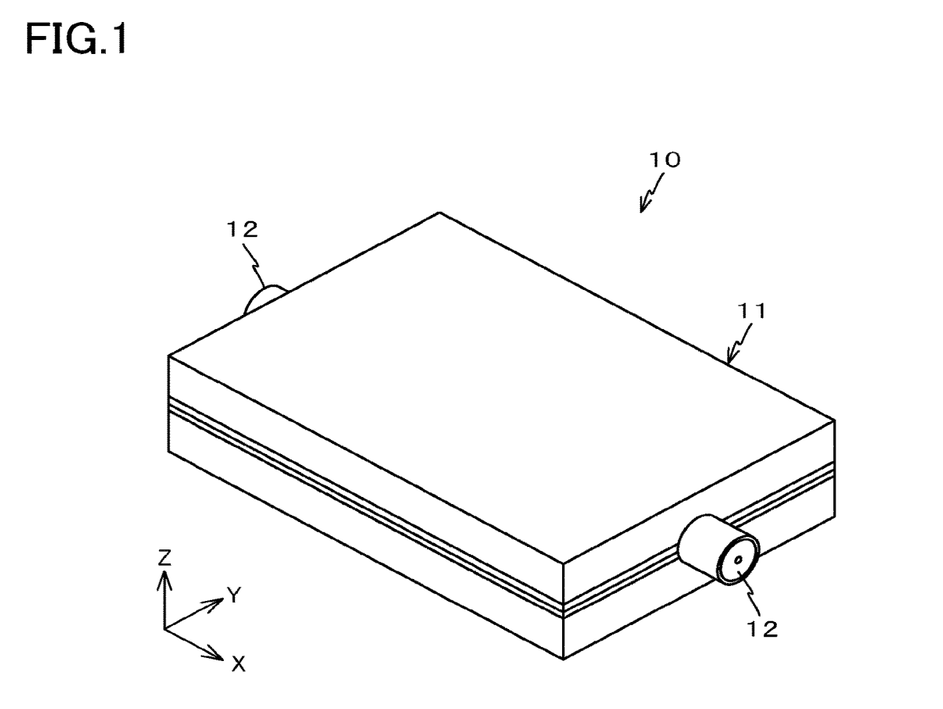
FIG. 1 is a perspective view of a high-frequency module.

FIG. 1 is a perspective view of a high-frequency module 10 according to this embodiment. The high-frequency module 10 is a device that amplifies, for example, microwave signals. The high-frequency module 10 is connected with, for example, a device for signal processing or communication and an antenna via connectors 12 provided on a module main unit 11.

Figure 2:
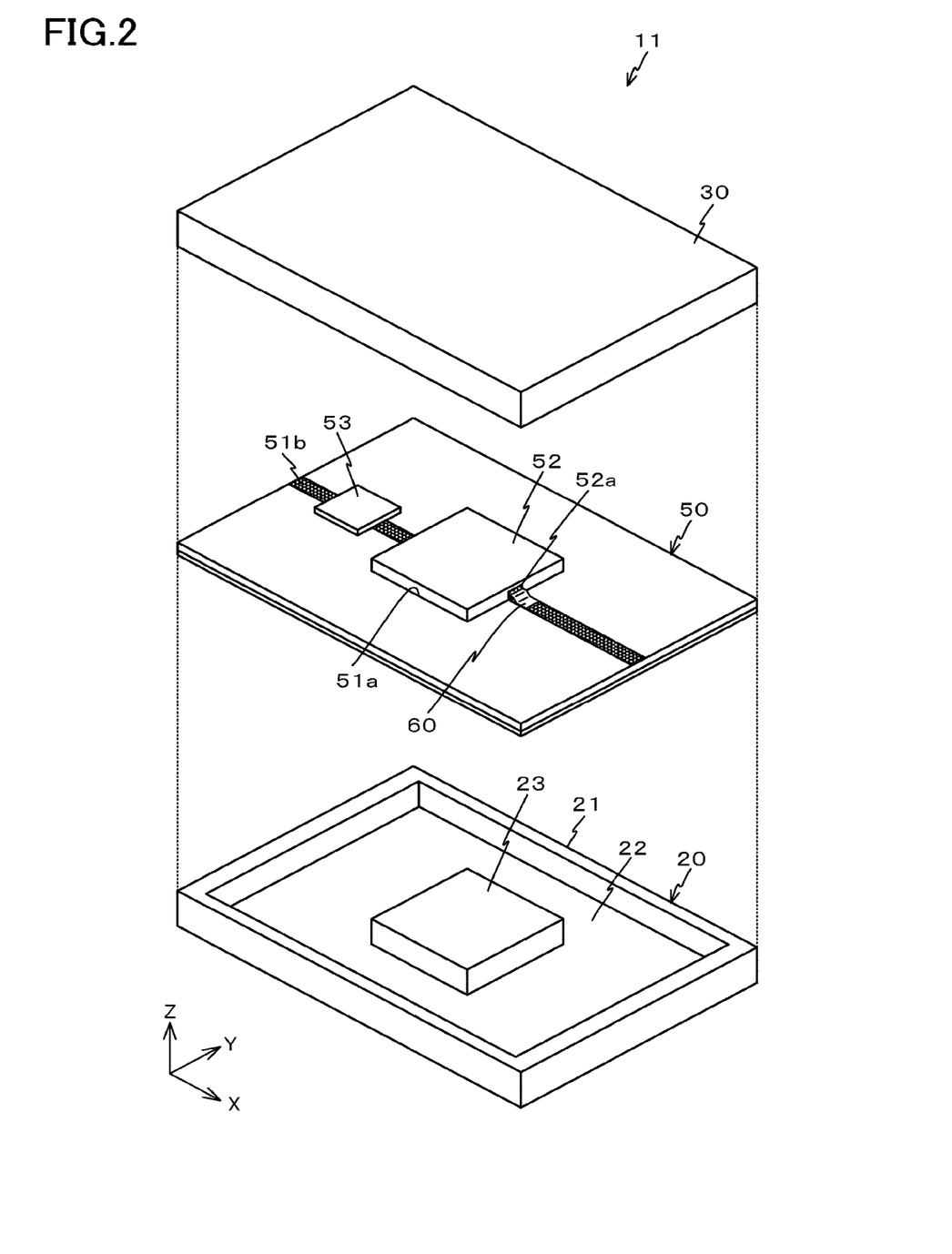
FIG. 2 is an exploded perspective view of a module main unit.

FIG. 2 is an exploded perspective view of the module main unit 11. As illustrated in FIG. 2, the module main unit 11 includes a casing 20, a wiring board 50, and a cover 30.

The casing 20 is, for example, a metal casing formed of a metal like aluminum which has a high electrical conductivity and which also has a high thermal conductivity. This casing 20 includes a bottom 22, a frame 21 formed along the outer edge of the bottom 22, and a protrusion 23 provided at the center of the bottom 22. The protrusion 23 protrudes upwardly from the upper face of the bottom 22.

The cover 30 is formed of a metal like aluminum that has a high electrical conductivity like the casing 20, and includes a top panel, and a frame formed along the outer edge of the top plate.

Figure 3:
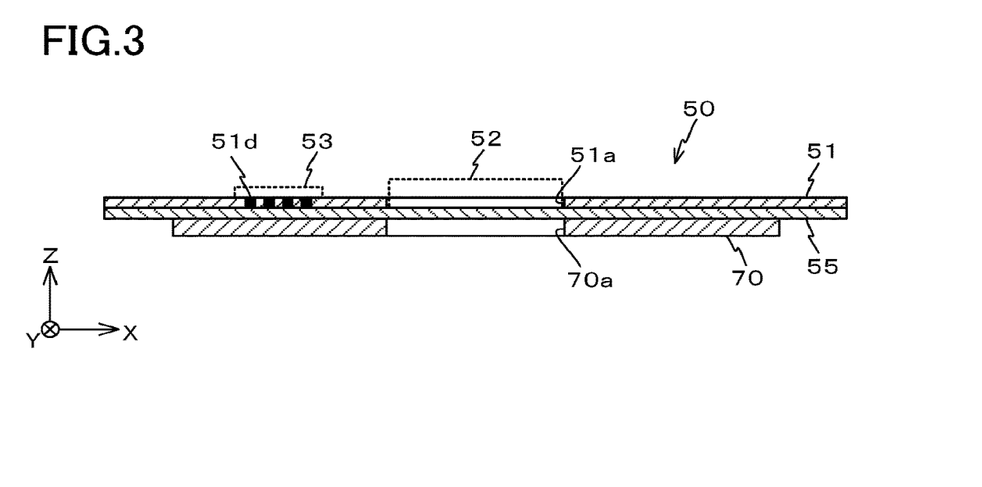
FIG. 3 is a cross-sectional view of a wiring board.

FIG. 3 is a cross-sectional view of the wiring board 50. As illustrated in FIG. 3, the wiring board 50 includes a metal core 55, a microwave propagation multilayer wiring board 51 disposed on the upper face of the metal core 55, and a multilayer wiring board 70 for a timing control logic circuit and an energy storage and regulation circuit disposed on the lower face of the metal core 55.

The metal core 55 is, for example, formed of copper or aluminum that has a high thermal conductivity, and has a thickness of substantially 0.5 mm.

The microwave propagation multilayer wiring board 51 is a board mainly consisting of, for example, an epoxy resin or a fluorine resin, and has a lower face bonded to the metal core 55. A cavity 51a is formed at the center part of the microwave propagation multilayer wiring board 51. The upper face of the metal core 55 is exposed via this cavity 51a.

Figure 4:
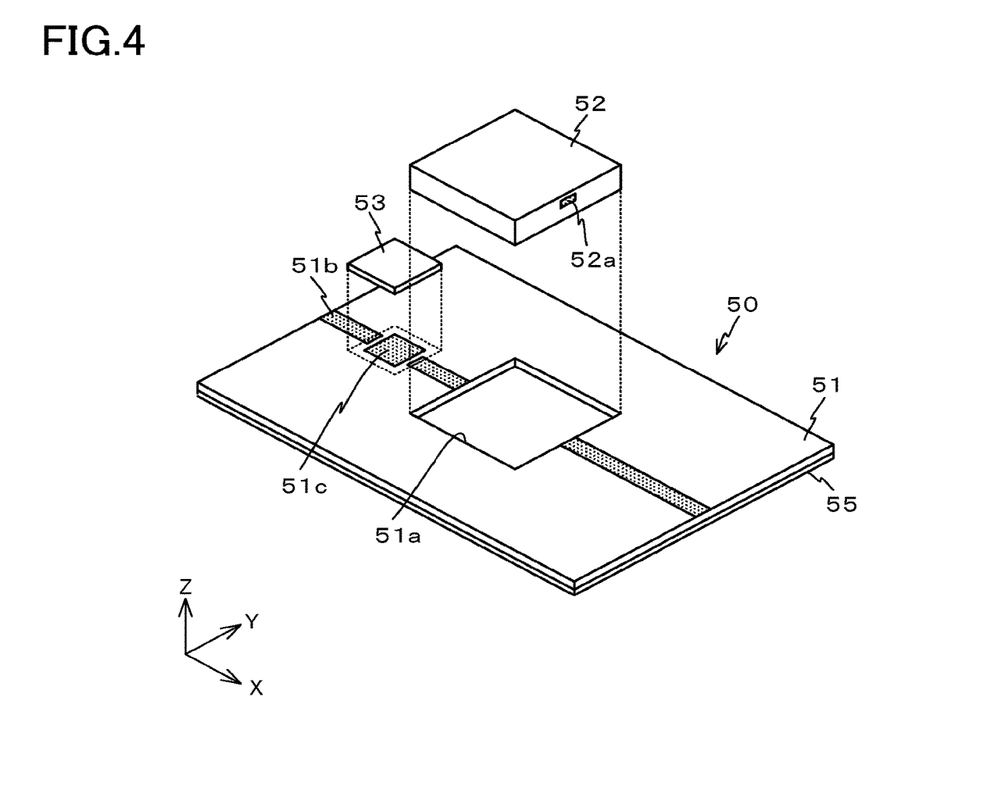
FIG. 4 is a perspective view of a microwave propagation multilayer wiring board.

As illustrated in FIG. 4, a pad 51c where the microwave active device 53 is to be mounted is formed at a −X side of the cavity 51a. As illustrated in FIG. 3, the pad 51c is electrically connected with the metal core 55 via multiple thermal through-holes 51d provided in the microwave propagation multilayer wiring board 51.

The thermal through-hole 51d is a through hole which has a thermal resistance reduced and which has a thermal conductivity enhanced. This thermal through-hole 51d is formed by forming a through-hole in the microwave propagation multilayer wiring board 51, and applying a copper plating to the internal wall of this through-hole so as to have a thick plating thickness. The thermal through-hole 51d may be formed by filling a conductive paste with an excellent thermal conductivity into the through-hole that has the internal wall to which copper plating is applied. In addition, the thermal through-hole 51d may be formed by filling a conductive paste in the through-hole without applying a copper plating. Note that in order to form the pad 51c appropriate for the surface mounting, a cover plating is applied on the thermal through holes 51d.

A microwave transmission path 51b which runs through the center of the microwave propagation multilayer wiring board 51, and which reaches the +X-side end of the microwave propagation multilayer wiring board 51 from the −X-side end thereof is formed on the upper face of the microwave propagation multilayer wiring board 51.

The microwave transmission path 51b includes three portions: a transmission path that reaches a nearby region of the pad 51c from the −X-side end of the microwave propagation multilayer wiring board 51; a transmission path that reaches the cavity 51a from the nearby region of the pad 51c; and a transmission path that reaches the +X-side end of the microwave propagation multilayer wiring board 51 from the cavity 51a. In addition, although it is not illustrated, a microwave passive device, such as a filter or a directional coupler, is formed on the microwave propagation multilayer wiring board 51.

The multilayer wiring board 70 is a multilayer wiring board on which control circuits and power circuits for the microwave high-output power amplifier 52 and the microwave active device 53 are formed. The control circuits and the power circuits are each formed by conductor patterns formed on the multilayer wiring board 70, and electronic components mounted (reflow mounting) on the multilayer wiring board 70.

As illustrated in FIG. 3, a cavity 70a is formed in the multilayer wiring board 70. The multilayer wiring board 70 is bonded to the lower face of the metal core 55 via, for example, prepreg with the cavity 70a being positioned so as to overlap the cavity 51a of the microwave propagation multilayer wiring board 51. The lower face of the metal core 55 is exposed via the cavity 70a of the multilayer wiring board 70.

As illustrated in FIG. 4, the microwave high-output power amplifier 52 and the microwave active device 53 are mounted on the wiring board 50.

The microwave high-output power amplifier 52 is an amplifier to amplify a microwave signal transmitted through the microwave transmission path 51b. As illustrated in FIG. 4, electrodes 52a are formed on a surface of the microwave high-output power amplifier 52 at the +X side, and a surface thereof at the −X side.

The microwave high-output power amplifier 52 is bonded to the upper face of the metal core 55 via the cavity 51a of the microwave propagation multilayer wiring board 51 by, for example, a solder or an electrically-conductive adhesive. In addition, the respective electrodes 52a provided on the microwave high-output power amplifier 52 are connected with the microwave transmission path 51b by electrodes 60 as illustrated in FIG. 2. However, the connection structure is not limited to this structure.

In addition, although it is not illustrated in the figure, the other electrodes of the microwave high-output power amplifier 52 are connected with the conductive layers of the multilayer wiring board 70 via through-hole conductors insulated from the metal core 55. Hence, the control circuit formed on the multilayer wiring board 70 is enabled to apply power to the microwave high-output power amplifier 52 and to control such a power application.

The microwave active device 53 is, for example, a phase shifter, a switch, an attenuator, a buffer amplifier, a limiter, a low-noise amplifier, or a package of those elements.

Figure 5:
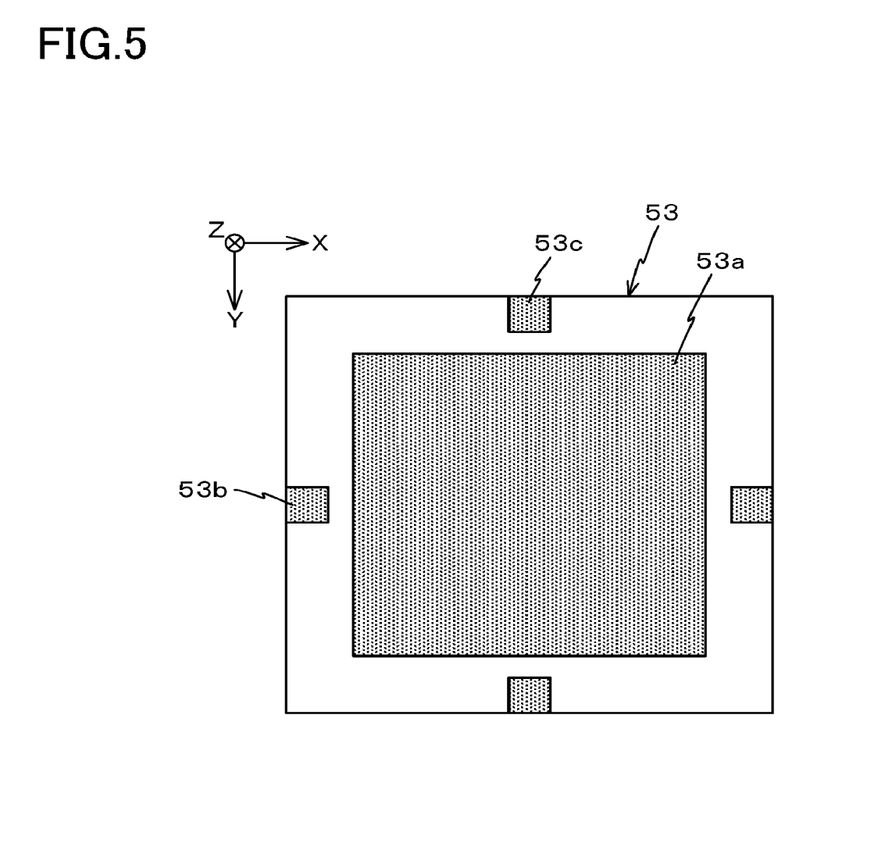
FIG. 5 is a plan view of a semiconductor device.

As illustrated in FIG. 5, a rectangular heat dissipation pad 53a is formed on the lower face (a surface at the −Z side) of the microwave active device 53. In addition, electrode pads 53b to be connected with the microwave transmission path 51b are formed at the +X side and −X side of the heat dissipation pad 53a, and electrode pads 53c to be mainly connected with the multilayer wiring board 70 are formed at the +Y side and −Y side of the heat dissipation pad 53a.

As is clear from FIG. 4, the microwave active device 53 is mounted on the microwave propagation multilayer wiring board 51. The heat dissipation pad 53a is connected with a pad 51c formed on the microwave propagation multilayer wiring board 51 by a solder, etc., and the electrode pad 53b is connected with the microwave transmission path 51b. It is not illustrated in the figure but the electrode pad 53c is connected with a circuit formed on the multilayer wiring board 70 via an unillustrated through-hole conductor electrically insulated from the metal core 55. This enables the control circuit formed on the multilayer wiring board 70 to apply power to the microwave active device 53 and to control such a power application.

Figure 6:
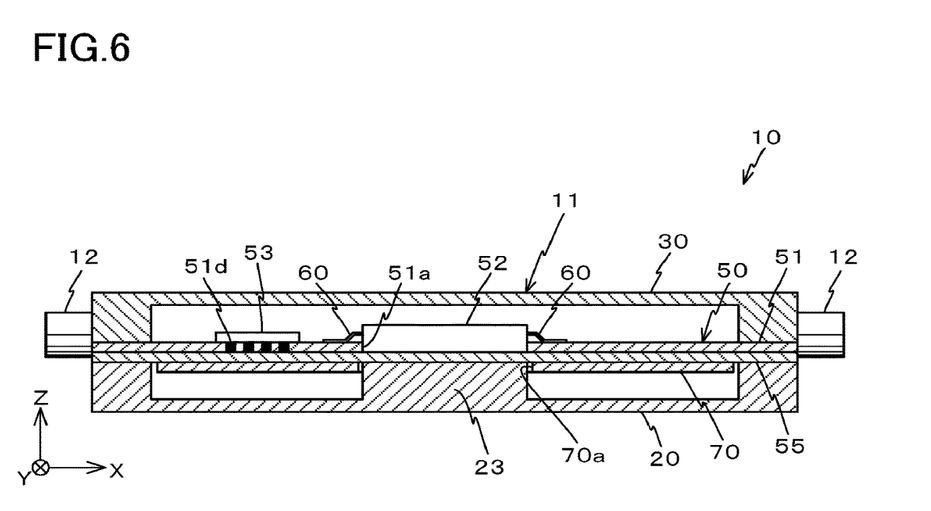
FIG. 6 is a diagram illustrating an XZ cross-section of the high-frequency module.

FIG. 6 is an XZ cross-sectional view of the high-frequency module 10. As is clear from FIG. 6, the above-explained wiring board 50 is mounted on the casing 20. In addition, the protrusion 23 of the casing 20 is bonded to the metal core 55 by a solder, an electrically-conductive adhesive, etc., via the cavity 70a of the multilayer wiring board 70. Still further, the cover 30 is fastened to the casing 20 by, for example, screws via the wiring board 50. Hence, the casing 20, the cover 30, and the wiring board 50 are integrated one another, and thus the module main unit 11 is formed. A connector 12 to be connected with the microwave transmission path 51b is attached to this module main unit 11. Accordingly, the high-frequency module 10 is accomplished.

As explained above, according to this embodiment, as illustrated in FIG. 6, the microwave high-output power amplifier 52 that has a large output is intimately in contact with the metal core 55 formed of a metal with a high thermal conductivity. In addition, the metal core 55 has a portion which is intimately in contact with the microwave high-output power amplifier 52 and which is also intimately in contact with the protrusion 23 of the casing 20 that serves as a heat sink. Hence, a thermal resistance between the microwave high-output power amplifier 52 and the casing 20 is reduced. Therefore, heat generated from the microwave high-output power amplifier 52 is efficiently transferred to the casing 20, and the casing 20 is capable of efficiently dissipating heat as the heat sink. Consequently, the temperature rise of the microwave high-output power amplifier 52 is suppressible, and the performance stability and operation stability of the high-frequency module 10 are improved. In addition, a deterioration of the microwave high-output power amplifier 52 due to overheating is suppressed, thereby extending the life of the device.

According to this embodiment, as illustrated in FIG. 6, the microwave active device 53 is connected with the metal core 51d via the multiple thermal through-holes 51d to which, for example, plating is applied. Hence, heat generated from the microwave active device 53 is transmitted to the casing 20 via the metal core 55, and then the casing 20 is capable of efficiently dissipating heat as the heat sink. Consequently, the temperature rise of the microwave active device 53 is suppressible, and the performance stability and operation stability of the high-frequency module 10 are improved. In addition, a deterioration of the microwave active device 53 due to overheating is suppressed, thereby extending the life of the device.

In addition, according to this embodiment, the metal core 55 formed of a metal is disposed between the microwave propagation multilayer wiring board 51 on which the microwave transmission path 51b is formed, and, the multilayer wiring board 70 on which the control circuits are formed. Hence, the metal core 55 functions as a shield, and thus the microwave propagation multilayer wiring board 51 and the multilayer wiring board 70 are electromagnetically shielded against each other. Therefore, the performance stability and the operation stability are improved without causing a false operation of the high-frequency module 10 and an abnormal operation thereof.

According to this embodiment, by grounding the metal core 55, the reference potential of the wiring board 50 becomes the potential of the metal core 55. In addition, the microwave transmission path 51b has no discontinuous contact for grounding. Therefore, the microwave is transmittable without any performance deterioration.

Conventional microwave transceivers include, for example, a metal plate and a casing that serve as a heat spreader, and various types of boards. According to such a type of microwave transceivers, various problems are involved, such as a high-frequency performance (grounding discontinuity), a reliability in accordance with an adverse effect to a joined portion due to thermal expansions of portions with different linear expansion coefficients, an electromagnetic wave interference, and prices. The microwave transceiver according to this embodiment has no discontinuous contact in the microwave transmission path, and has a relatively small number of components connected in series with the microwave transmission path. Therefore, the improved microwave transceiver of this embodiment is capable of addressing those problems.

Figure 7:
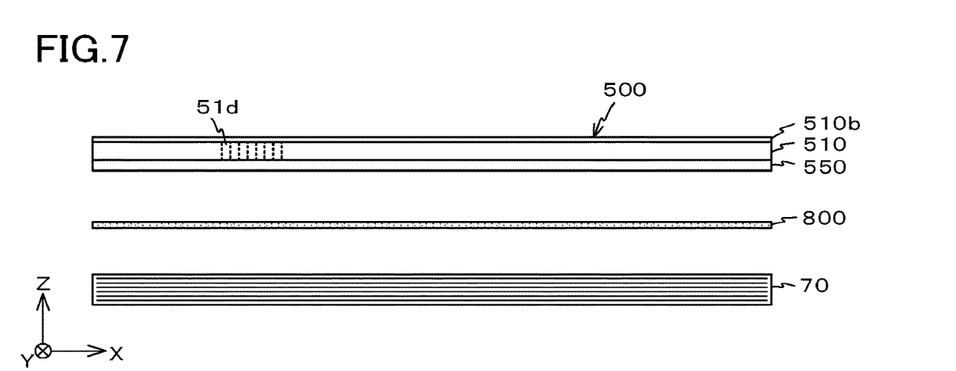
FIG. 7 is a diagram to explain a manufacturing procedure of the wiring board.

As an example, as illustrated in FIG. 7, the microwave propagation multilayer wiring board 51 and the metal core 55 may be formed by a copper clad laminate 500 that includes an insulation resin layer 510, a copper foil 510b bonded to the upper face of the insulation resin layer 510, and a metal layer 550 which is bonded to the lower face of the insulation resin layer 510. The copper foil 510b on the upper face of the insulation resin layer 510 having undergone patterning constructs a microwave transmission path 51b, a pad 51c, etc., of the microwave propagation multilayer wiring board 51. In addition, the metal layer 550 on the lower face of the insulation resin layer 510 constructs the metal core 55. The copper foil 510b that becomes the pad 51c is electrically connected with the metal layer 550 via thermal through-holes 51d formed in the insulation resin layer 510.

Figure 8:
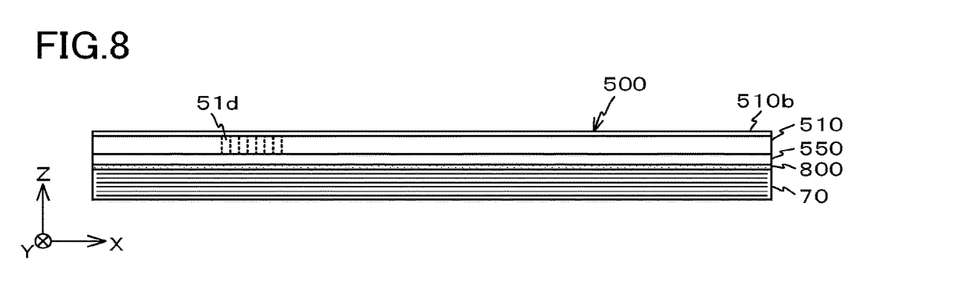
FIG. 8 is a diagram to explain a manufacturing procedure of the wiring board.

The copper clad laminate 500 and the multilayer wiring board 70 are bonded with each other via, for example, a prepreg 800. Hence, as illustrated in FIG. 8, the copper clad laminate 500 and the multilayer wiring board 70 are integrated with each other.

Figure 9:
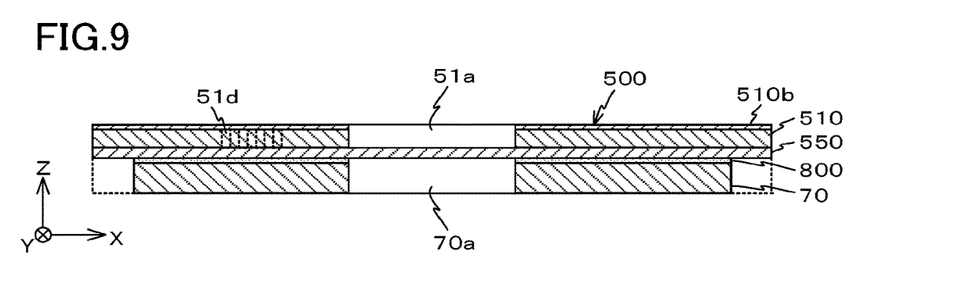
FIG. 9 is a diagram to explain a manufacturing procedure of the wiring board.

Next, a cavity 51a present in the copper foil 510b and the insulation resin layer 510 is formed in the copper clad laminate 500, and the cavity 70a is formed in the multilayer wiring board 70 by, for example, laser beam. Accordingly, the wiring board 50 is accomplished.

In addition, according to the above-explained the manufacturing method, the microwave propagation multilayer wiring board 51 and the metal core 55 are formed of the copper clad laminate 500. However, the present disclosure is not limited to this structure, and for example, as is clear from FIG. 10, only the microwave propagation multilayer wiring board 51 may be formed by the copper clad laminate 500 that includes the insulation resin layer 510, the copper foil 510b bonded to the upper face of the insulation resin layer 510, and a copper foil 510a bonded to the lower face of the insulation resin layer 510.

Figure 10:
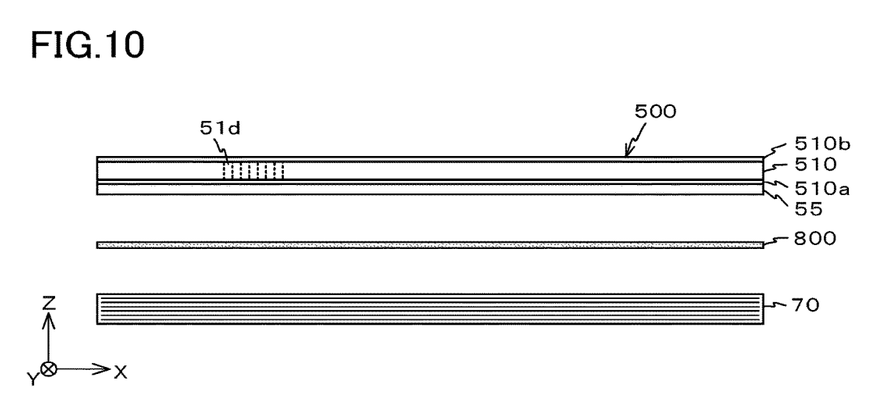
FIG. 10 is a diagram to explain a manufacturing procedure of the wiring board.

In this case, patterning is performed on the copper foil 510b of the copper clad laminate 500 to form the microwave transmission path 51b, the pad 51c, etc. In addition, as illustrated in FIG. 10, the metal core 55 is bonded to the lower face of the copper clad laminate 500 by, for example, an electrically-conductive adhesive. Hence, the copper clad laminate 500 and the metal core 55 are integrated with each other.

Next, as is clear from FIG. 10, the metal core 55 and the multilayer wiring board 70 are bonded with each other via the prepreg 800. Accordingly, the copper clad laminate 500, the metal core 55, and the multilayer wiring board 70 are integrated one another. In addition, the cavity 51a present in the copper foil 510b and the insulation resin layer 510 is formed, and the cavity 70a is formed in the multilayer wiring board 70 is formed. Therefore, the wiring board 50 is accomplished.

Still further, according to this embodiment, the connection between the microwave propagation multilayer wiring board 51 and the multilayer wiring board 70 is realized by the through-hole conductors 51d as illustrated in FIGS. 6, 7, and 10, etc. Hence, a labor work for connecting the microwave propagation multilayer wiring board 51 and the multilayer wiring board 70 is unnecessary, reducing the price of the product.

An embodiment of the present disclosure was explained above, but the present disclosure is not limited to the aforementioned embodiment. For example, in the above embodiment, the explanation was given of an example case in which the microwave active device 53 is mounted on the surface of the microwave propagation multilayer wiring board 51. However, the present disclosure is not limited to this structure, and for example, the microwave propagation multilayer wiring board 51 may employ a multilayer structure, and the microwave active device 53 may be embedded and mounted inside the microwave propagation multilayer wiring board 51.

Figure 11:
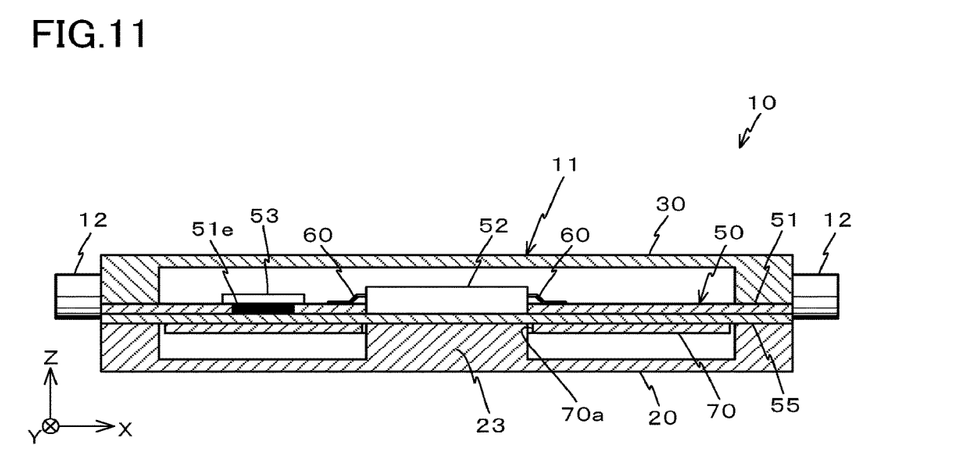
FIG. 11 is a diagram illustrating a modified example of a high-frequency module.

In addition, as illustrated in FIG. 11, the pad 51*c* on which the microwave active device 53 is mounted may be formed by an upper face of a metal member 51*e* that is in a columnar or cuboid shape like a copper inlay. When the metal member 51*e* is embedded in the microwave propagation multilayer wiring board 51, and for example, the upper face is polished, the pad 51*c* is accomplished. By connecting the microwave active device 53 with the metal core 55 via the metal member 51*e*, a thermal resistance between the microwave active device 53 and the metal core 55 becomes quite small. Hence, in comparison with a case in which the microwave active device 53 is connected with the metal core 55 via the thermal through-holes 51*d*, the microwave active device 53 is further efficiently cooled.

Figure 12:
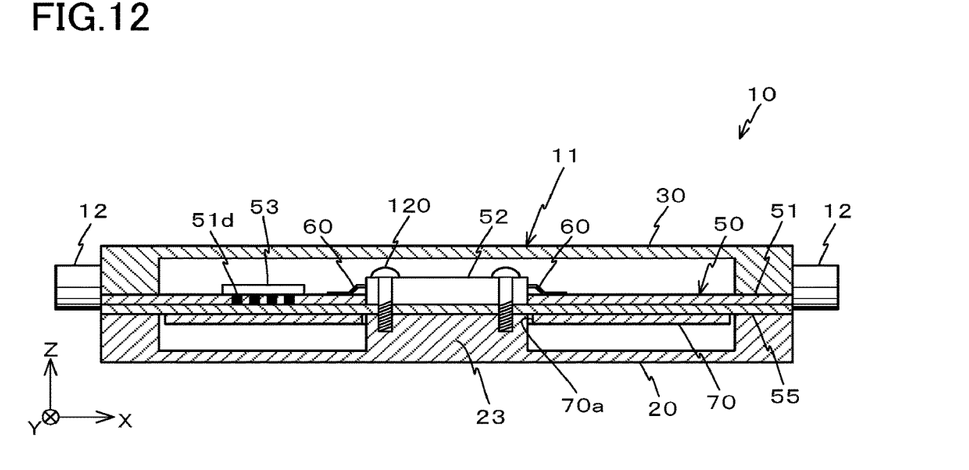
FIG. 12 is a diagram illustrating a modified example of a high-frequency module.

In the above embodiment, the microwave high-output power amplifier 52 is bonded to the metal core 55. However, the present disclosure is not limited to this structure, and for example, as illustrated in FIG. 12, the microwave high-output power amplifier 52 may be fastened to the protrusion 23 of the casing 20 by screws 120. In this case, the screws 120 cause the microwave high-output power amplifier 52, the metal core 55, and the casing 20 to be intimately in contact with each other. Hence, heat from the microwave high-output power amplifier 52 is efficiently dissipated from the casing 20 that serves as a heat sink.

In the above embodiment, the explanation was given of an example case in which the single microwave active device 53 is mounted on the microwave propagation multilayer wiring board 51. However, the present disclosure is not limited to this structure, and multiple microwave active devices 53 may be mounted on the microwave propagation multilayer wiring board 51.

Figure 13:
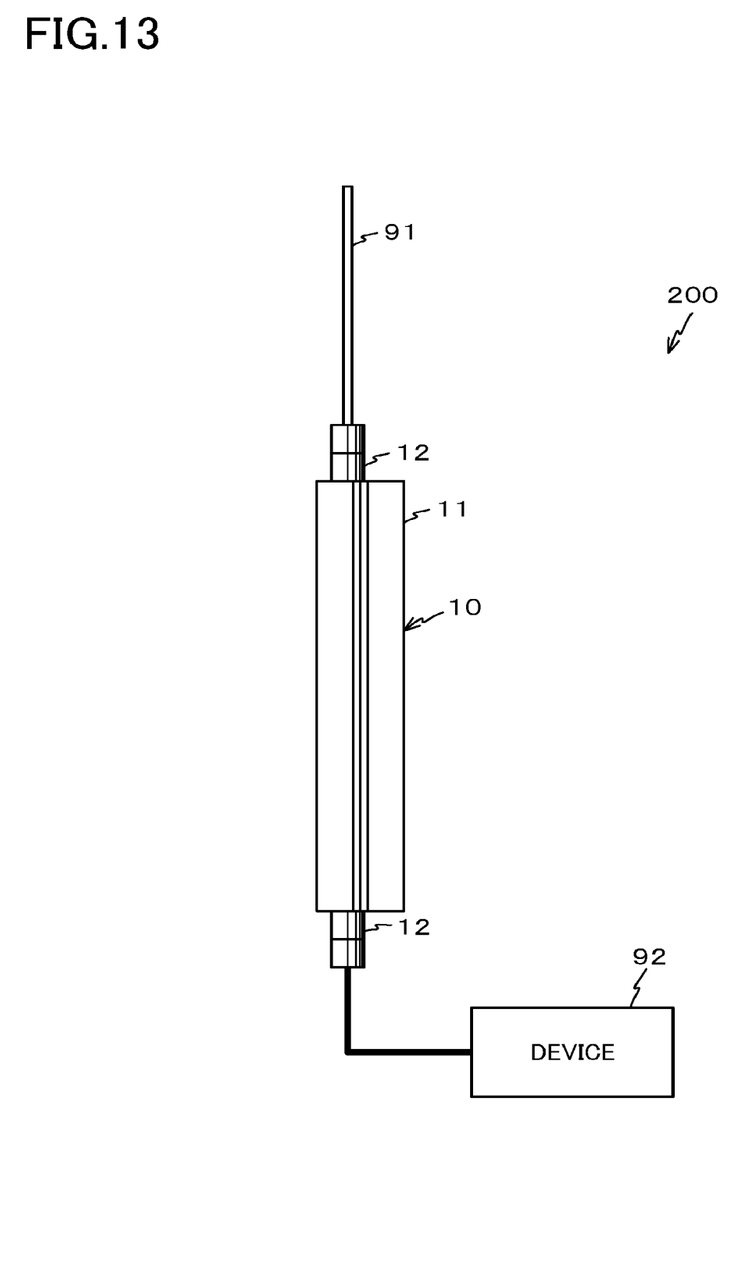
FIG. 13 is a diagram illustrating a microwave transceiver.

As illustrated in FIG. 13, the high-frequency module 10 constructs a microwave transceiver 200 when connected with a radiator 91 like a printed dipole antenna element, and a device 92 for signal processing or communication. The high-frequency module 10 is packaged by the casing 20 and the cover 30. This facilitates a construction of a transceiver system that includes the multiple microwave transceivers 200.

Figure 14:
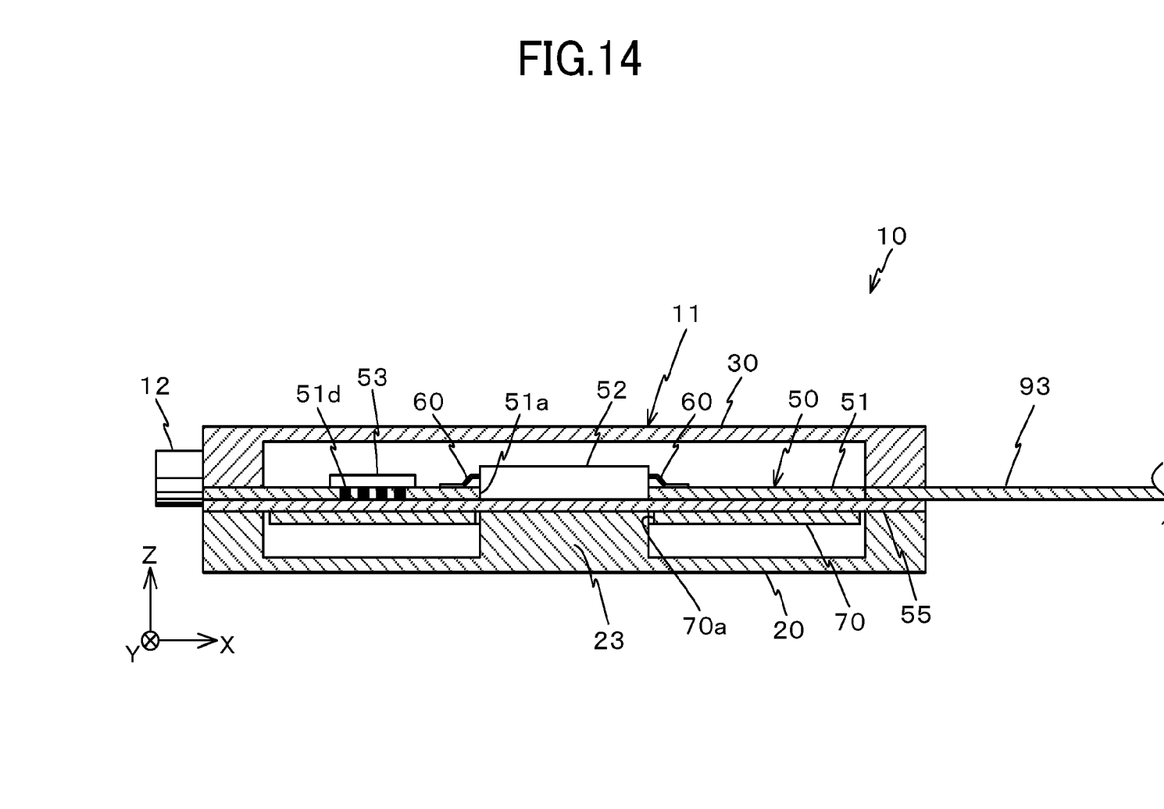
FIG. 14 is a diagram illustrating a modified example of a microwave transceiver.

As illustrated in FIG. 14, a microwave wiring board 93 of the device 92 may be directly connected with the microwave propagation multilayer wiring board 51. In this case, the microwave wiring board 93 of the device 92 is mounted on the metal core 55 in a manner intimately contacting therewith. Hence, a grounding (GND) potential reference is unified for the high-frequency module 10 of this embodiment and the other device 92, thereby accomplishing a structure that has no discontinuous contact between the microwave propagation multilayer wiring board 51 and the microwave wiring board 93.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A high-frequency module characterized by comprising a device, the high-frequency module further comprising:
    a first board in which an opening is formed, and which includes a transmission circuit formed on a surface at a first side, the transmission circuit transmits a microwave;
    a first device disposed in the opening of the first board;
    a second board which is disposed at a second side of the first board, and which is formed with a control circuit for the first device, and in which an opening is formed at a location overlapping the first device;
    a metal core which is disposed between the first board and the second board, and which is in contact with the first device; and
    a casing which is formed of a metal, and which includes a connection connected with the metal core via the opening of the second board.

2. The high-frequency module according to claim 1, characterized in that the first device has any surface intimately in contact with the metal core.

3. The high-frequency module according to claim 2, characterized in that the first device is a power amplifier.

4. The high-frequency module according to claim 3, characterized in that:
    a second device different from the first device is mounted on the first board; and
    the second device is connected with the metal core via a conductor provided at the first board.

5. A microwave transceiver characterized by comprising the high-frequency module according to claim 3.

6. The high-frequency module according claim 2, characterized in that:
    a second device different from the first device is mounted on the first board; and
    the second device is connected with the metal core via a conductor provided at the first board.

7. A microwave transceiver characterized by comprising the high-frequency module according to claim 2.

8. The high-frequency module according to claim 1, characterized in that:
    a second device different from the first device is mounted on the first board; and
    the second device is connected with the metal core via a conductor provided at the first board.

9. The high-frequency module according to claim 8, characterized in that the conductor provided at the first board is a thermal through-hole.

10. A microwave transceiver characterized by comprising the high-frequency module according to claim 9.

11. The high-frequency module according to claim 8, characterized in that the conductor provided at the first board is a copper inlay.

12. A microwave transceiver characterized by comprising the high-frequency module according to claim 11.

13. A microwave transceiver characterized by comprising the high-frequency module according to claim 8.

14. A microwave transceiver characterized by comprising the high-frequency module according to claim 1.

* * * * *